(12) United States Patent
Fukushima

(10) Patent No.: US 7,585,736 B2
(45) Date of Patent: Sep. 8, 2009

(54) METHOD OF MANUFACTURING SEMICONDUCTOR DEVICE WITH REGARD TO FILM THICKNESS OF GATE OXIDE FILM

(75) Inventor: Yoichi Fukushima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 375 days.

(21) Appl. No.: 11/723,092

(22) Filed: Mar. 16, 2007

(65) Prior Publication Data
US 2007/0218666 A1    Sep. 20, 2007

(30) Foreign Application Priority Data
Mar. 16, 2006  (JP) ............... 2006-072048
Jan. 24, 2007  (JP) ............... 2007-014254

(51) Int. Cl.
*H01L 21/336* (2006.01)
(52) U.S. Cl. .............. 438/287; 438/275; 438/294; 438/981; 257/E21.159; 257/E21.477
(58) Field of Classification Search ........... 438/218, 438/224, 228, 295; 257/E21.051, E21.159, 257/E21.177, E21.191, E21.37, E21.4, E21.477
See application file for complete search history.

(56) References Cited
U.S. PATENT DOCUMENTS
6,468,867 B1 * 10/2002 Lai et al. ............... 438/275
6,979,623 B2 * 12/2005 Rotondaro et al. ......... 438/287
2005/0239248 A1 * 10/2005 Lee ..................... 438/257

FOREIGN PATENT DOCUMENTS
| JP | 11-097383 | 4/1999 |
|---|---|---|
| JP | 2001-308198 | 11/2001 |
| JP | 2005-005668 | 1/2005 |
| JP | 2005-129711 | 5/2005 |
| JP | 2005-286141 | 10/2005 |

* cited by examiner

*Primary Examiner*—Savitri Mulpuri
*Assistant Examiner*—Cheung Lee
(74) *Attorney, Agent, or Firm*—Young & Thompson

(57) ABSTRACT

A method of manufacturing a semiconductor device includes steps (a) to (d). The step (a) is a step of forming a first insulating film and a nitride film on a semiconductor substrate in this order. The step (b) is a step of removing said first insulating film and said nitride film in a first region while leaving said first insulating film and said nitride film in a second region. The step (c) is a step of forming a second insulating film on said semiconductor substrate in said first region. Here, a thickness of said second insulating film is different from that of said first insulating film. A third insulating film is formed on said nitride film in said second region along with the formation of said second insulating film. The step (d) is a step of removing said third insulating film and said nitride film in said second region.

17 Claims, 10 Drawing Sheets

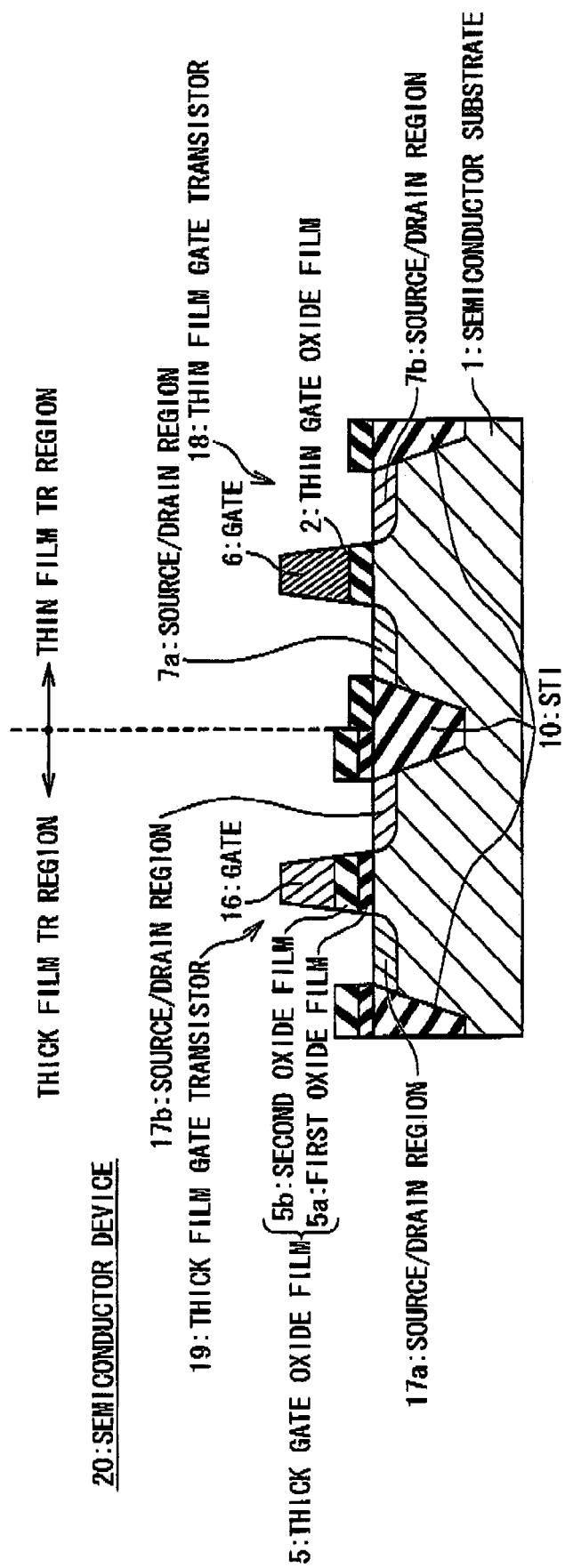

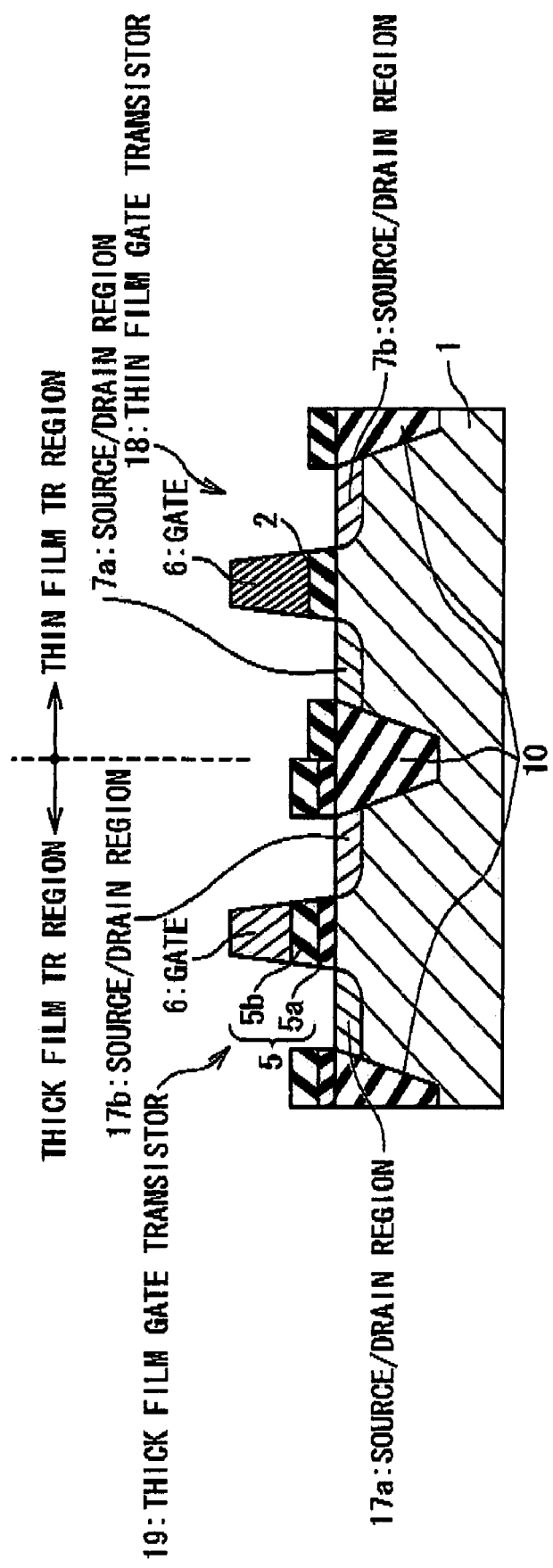

METHOD OF MANUFACTURING SEMICONDUCTOR DEVICE WITH REGARD TO FILM THICKNESS OF GATE OXIDE FILM

BACKGROUND OF THE INVENTION

1. Field of the Invention

The present invention relates to a method of manufacturing a semiconductor device, and more particularly relates to a method of manufacturing a semiconductor device with regard to a film thickness of a gate oxide film.

2. Description of the Related Art

There are techniques known for forming a plurality of transistors in which film thicknesses of gate oxide films are different from each other on the same substrate. For example, Japanese Laid-Open Patent Application (JP-P2005-5668A) discloses a method of manufacturing a dual gate oxide film. This conventional technique will be described below.

FIGS. 1A to 1C and FIGS. 2A to 2C are sectional views showing the method of manufacturing the dual gate oxide film, in this conventional technique. In each of the drawings, the left side indicates the region where the transistor having the thick gate oxide film is formed (hereafter, referred to as the thick film Tr region), and the right side indicates the region where the transistor having the thin gate oxide film is formed (hereafter, referred to as the thin film Tr region).

With reference to FIG. 1A, an isolation region (STI: Shallow Trench Isolation) 110 is firstly formed in a silicon substrate 101. Next, with reference to FIG. 1B, the surface of the silicon substrate 101 is oxidized to form a first gate oxide film 102 such that the first gate oxide film 102 covers the surface of the silicon substrate 101. After that, with reference to FIG. 1C, a lithography operation is used to mask the thick film Tr region with a resist 103, and the resist 103 is patterned so as to open only the thin film Tr region. Next, with reference to FIG. 2A, the first gate oxide film 102 in the thin film Tr region is wet-etched by using an acidic chemical solution. Consequently, the first gate oxide film 102 in the thin film Tr region is removed.

At this time, in the boundary between the thin film Tr region and the thick film Tr region, the chemical solution invades the interface between the resist 103 and the first gate oxide film 102. For this reason, an end 120 of the first gate oxide film 102 in the thick film Tr region is partially etched. After that, with reference to FIG. 2B, the resist 103 is removed. The end 120 of the first gate oxide film 102 in the thick film Tr region becomes thinner towards the thin film Tr region, in the boundary between the thick film Tr region and the thin film Tr region. Then, with reference to FIG. 2C, a second gate oxide film 104 is formed. Consequently, the gate oxide film having the thin film thickness, which is constituted by only the second gate oxide film 104, can be formed in the thin film Tr region. On the other hand, the gate oxide film having the thick film thickness, in which the first gate oxide film 102 and the second gate oxide film 104 are laminated, can be formed in the thick film Tr region. However, in a region P of the boundary of the thick film Tr region, the film thickness becomes thin. For this reason, since the transistor cannot be formed in this region P, this is defined as a forbidden region where the placement of the transistors is forbidden when a circuit is designed. In future, as the miniaturization of a semiconductor circuit is advanced, this forbidden region exhibits the severe influence as the new subject of the miniaturization. The technique is desired which can reduce the forbidden region in the boundary between the thin film Tr region and the thick film Tr region. The technique is desired which can attain the miniaturization of the semiconductor circuit efficiently without any waste of regions in a semiconductor chip.

In conjunction with the above technique, Japanese Laid Open Patent Application (JP-P2005-129711A) discloses a semiconductor device and a method of manufacturing the same. This method of manufacturing the semiconductor device includes: a step of forming a bottom oxide film on a semiconductor substrate of a memory transistor formation region and a peripheral circuit transistor formation region; a step of forming a nitride film on the bottom oxide film; a step of forming a top oxide film on the nitride film; a step of removing the top oxide film, the nitride film and the bottom oxide film in the peripheral circuit transistor formation region to expose the surface of the semiconductor substrate in the peripheral circuit transistor formation region; a step f executing a heat treatment in the atmosphere having nitrogen and oxygen in each of the semiconductor substrate of the peripheral circuit transistor formation region and the top oxide film of the memory transistor formation region; and a step of forming a gate insulating film on the semiconductor substrate in the peripheral circuit transistor formation region.

SUMMARY OF THE INVENTION

An object of the present invention is to provide a method of manufacturing a semiconductor device that can reduce the forbidden region in the boundary between the thin film Tr region and the thick film Tr region.

Also, another object of the present invention is to provide a method of manufacturing a semiconductor device that can attain the miniaturization of the semiconductor device efficiently without any waste of regions in a semiconductor chip.

This and other objects, features and advantages of the present invention will be readily ascertained by referring to the following description and drawings.

In order to achieve an aspect of the present invention, the present invention provides a method of manufacturing a semiconductor device comprising: (a) forming a first insulating film and a nitride film on a semiconductor substrate in this order; (b) removing said first insulating film and said nitride film in a first region while leaving said first insulating film and said nitride film in a second region; (c) forming a second insulating film on said semiconductor substrate in said first region, wherein a thickness of said second insulating film is different from that of said first insulating film, and a third insulating film is formed on said nitride film in said second region along with the formation of said second insulating film; and (d) removing said third insulating film and said nitride film in said second region.

In the method of manufacturing a semiconductor device, said step (d) may include: removing said third insulating film by using a chemical solution which dissolves said third insulating film rather than said nitride film; and removing said nitride film by using a chemical solution which dissolves said nitride film rather than said second insulating film.

In the method of manufacturing a semiconductor device, said step (d) may include: removing said third insulating film and said nitride film in said second region by a dry-etching method.

The method of manufacturing a semiconductor device, said step (d) may further include: executing a heat treatment of said semiconductor substrate in an atmosphere having nitrogen and oxygen after said removing by the dry-etching method.

In the method of manufacturing a semiconductor device, said step (b) may include: removing said first insulating film and said nitride film in said first region by a dry-etching method.

In the method of manufacturing a semiconductor device, said step (b) may further include: executing a heat treatment of said semiconductor substrate in an atmosphere having nitrogen and oxygen after said removing by the dry-etching method.

In the method of manufacturing a semiconductor device, said step (d) may include: removing said third insulating film by using a chemical solution which dissolves said third insulating film rather than said nitride film; and removing said nitride film by using a chemical solution which dissolves said nitride film rather than said second insulating film In the method of manufacturing a semiconductor device, said step (d) may include: removing said third insulating film and said nitride film in said second region by a dry-etching method.

In the method of manufacturing a semiconductor device, said step (d) may further include: executing a heat treatment of said semiconductor substrate in an atmosphere having nitrogen and oxygen after said removing by the dry-etching method.

In the method of manufacturing a semiconductor device, said first insulating film may be one of a silicon oxide film and a silicon oxynitride film. Said second insulating film may be one of a silicon oxide film and a silicon oxynitride film. Said nitride film may be a silicon nitride film.

In the method of manufacturing a semiconductor device, said step (b) may include: removing said first insulating film and said nitride film in said first region by a dry-etching method.

In the method of manufacturing a semiconductor device, said step (b) may further include: executing a heat treatment of said semiconductor substrate in an atmosphere having nitrogen and oxygen after said removing by the dry-etching method.

In the method of manufacturing a semiconductor device, said step (c) may include: executing an oxidation of said semiconductor substrate. Said second insulating film may be composed of an oxide film formed by said heat treatment and an oxide film formed by said oxidation on said semiconductor substrate. Said third insulating film may be composed of an oxide film formed by said heat treatment and an oxide film formed by said oxidation film on said nitride film.

In the method of manufacturing a semiconductor device, said step (d) may include: removing said third insulating film by using a chemical solution which dissolves said third insulating film rather than said nitride film; and removing said nitride film by using a chemical solution which dissolves said nitride film rather than said second insulating film.

In the method of manufacturing a semiconductor device, said step (d) may include: removing said third insulating film and said nitride film in said second region by a dry-etching method.

In the method of manufacturing a semiconductor device, said step (d) may further include: executing a heat treatment of said semiconductor substrate in an atmosphere having nitrogen and oxygen after said removing by the dry-etching method.

The method of manufacturing a semiconductor device may further include: (e) forming a first gate of a first transistor at a predetermined position in said first region, and a second gate of a second transistor at a predetermined position in said second region; and (f) forming a source and a drain of said first transistor with respect to said first gate in a self-alignment manner, and a source and a drain of said second transistor with respect to said second gate in a self-alignment manner.

BRIEF DESCRIPTION OF THE DRAWINGS

FIG. 3 is a sectional view showing a semiconductor device that is manufactured in an embodiment of a method of manufacturing a semiconductor device according to the present invention;

FIGS. 6A to 6C are sectional views showing an embodiment of a method of manufacturing a semiconductor device according to the present invention.

DESCRIPTION OF THE PREFERRED EMBODIMENTS

Figure 1A:
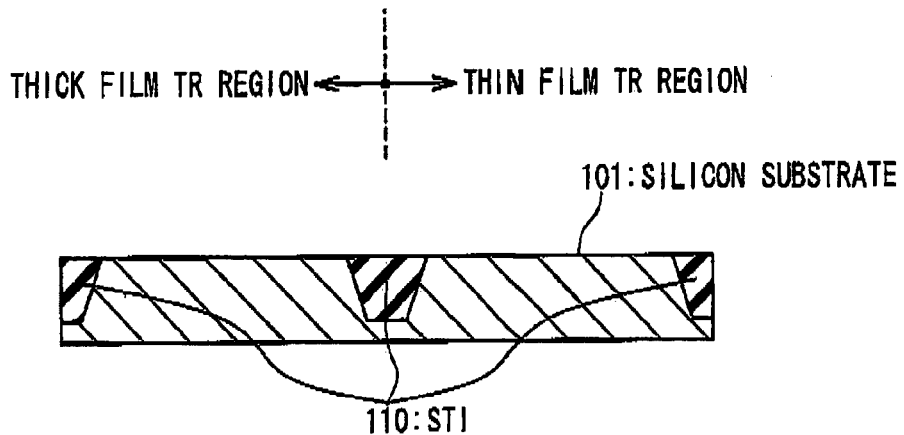
FIGS. 1A to 1C are sectional views showing a method of manufacturing a dual gate oxide film of a conventional technique.
Figure 1B:
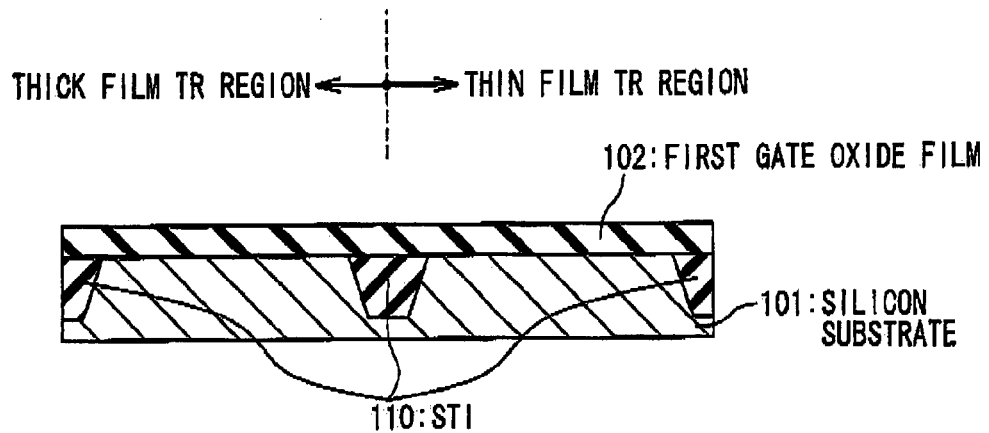
Figure 1C:
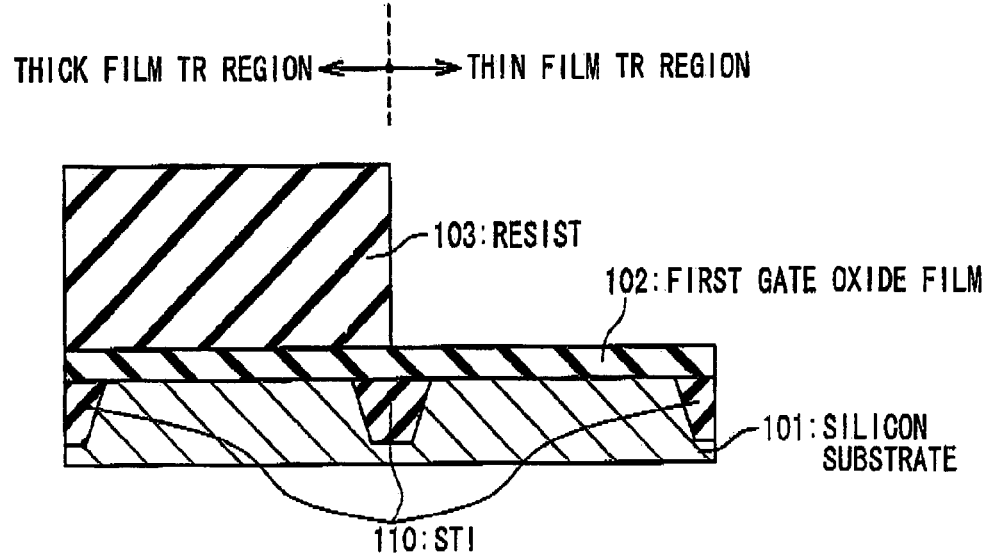

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiment of a method of manufacturing a semiconductor device according to the present invention will be described below with reference to attached drawings.

FIG. 3 is a sectional view showing one example of the semiconductor device that is manufactured in the embodiment of the method of manufacturing the semiconductor device according to the present invention, A semiconductor device 20 has a thick film Tr region (the left side of the drawing) and a thin film Tr region (the right side of the drawing). Here, the thick film Tr region is a region where thick film gate transistors are formed. The thick film gate transistor has the gate oxide film of a thick film thickness. The thin film Tr region is a region where thin film gate transistors are formed. The thin film gate transistor has the gate oxide film of a thin film thickness. In the thick film Tr region, a thick film gate transistor 19 is formed between isolation regions (STI) 10 installed on a semiconductor substrate 1. In the thin film Tr region, a thin film gate transistor 18 is formed between the isolation regions 10 installed on the semiconductor substrate 1.

The thick film gate transistor 19 includes a source/drain region 17a, a source/drain region 17b, a thick gate oxide film 5 and a gate 16. The source/drain region 17a and the source/drain region 17b are formed at a predetermined interval on the upper surface of the semiconductor substrate 1. The thick gate oxide film 5 is formed on the semiconductor substrate 1 between the source/drain region 17a and the source/drain region 17b (a channel region), and has a relatively thick film thickness. The thick gate oxide film 5 includes a first oxide film 5a and a second oxide film 5b. The gate 16 is formed on the thick gate oxide film 5.

On the other hand, the thin film gate transistor 18 includes a source/drain region 7a, a source/drain region 7b, a thin gate oxide film 2 and a gate 6. The source/drain region 7a and the source/drain region 7b are formed at a predetermined interval on the upper surface of the semiconductor substrate 1. The thin gate oxide film 2 is formed on the semiconductor substrate 1 between the source/drain region 7a and the source/drain region 7b (a channel region), and has a relatively thin film thickness. The gate 6 is formed on the thin gate oxide film 2.

Incidentally, the thick film gate transistor 19 and the thin film gate transistor 18 shown in FIG. 3 are indicated as examples. The present invention is not limited to these examples. If the transistor (including a memory cell) having the gate oxide film of the thick film thickness is formed in the thick film Tr region and if the transistor (including a memory cell) having the gate oxide film of the thin film thickness is formed in the thin film Tr region, the structure of each transistor does not matter.

The embodiment of the method of manufacturing the semiconductor device according to the present invention will be described below with reference to attached drawings. FIGS. 4A to 4C, FIGS. 5A to 5C and FIGS. 6A to 6C are sectional views showing the embodiment of the method of manufacturing the semiconductor device according to the present invention. Here, the case of manufacturing the semiconductor device 20 shown in FIG. 3 will be explained below.

Figure 4A:
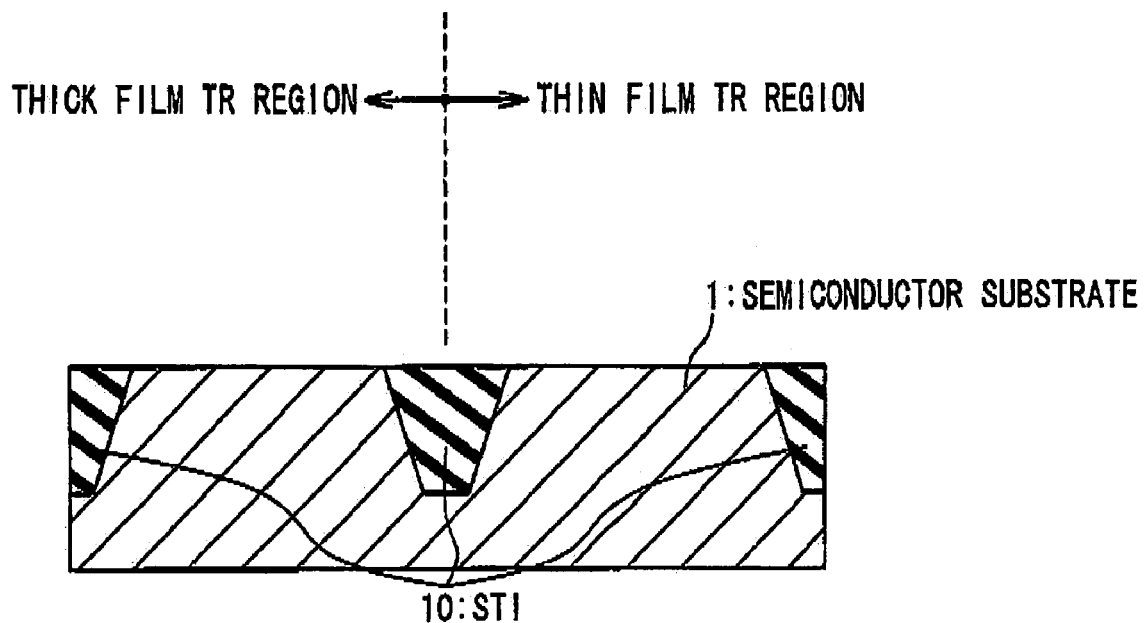
FIGS. 4A to 4C are sectional views showing an embodiment of a method of manufacturing a semiconductor device according to the present invention.
Figure 4B:
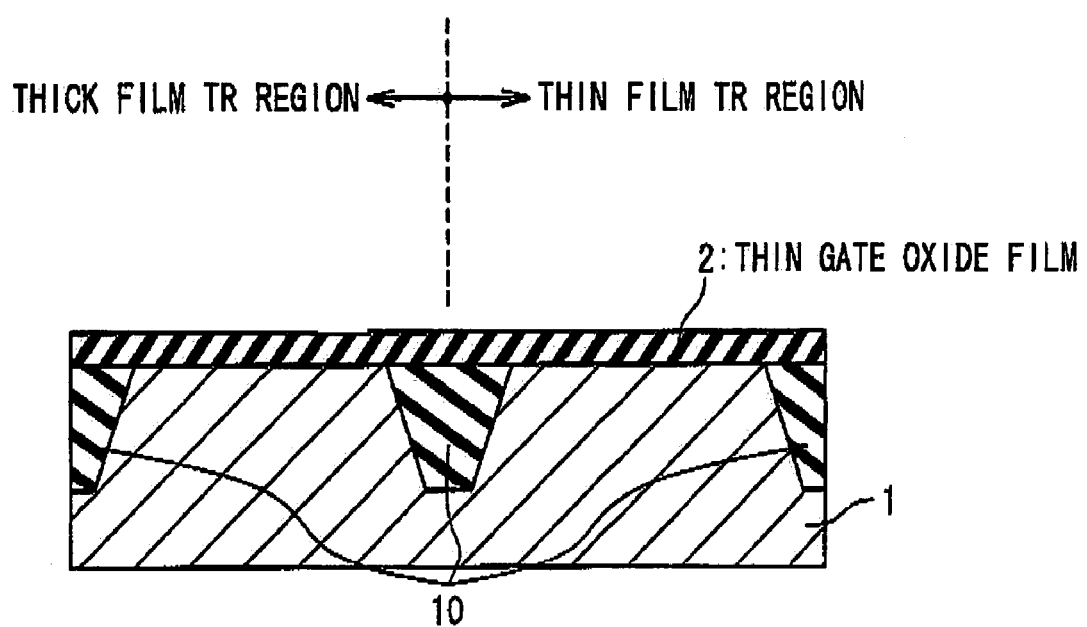
Figure 4C:
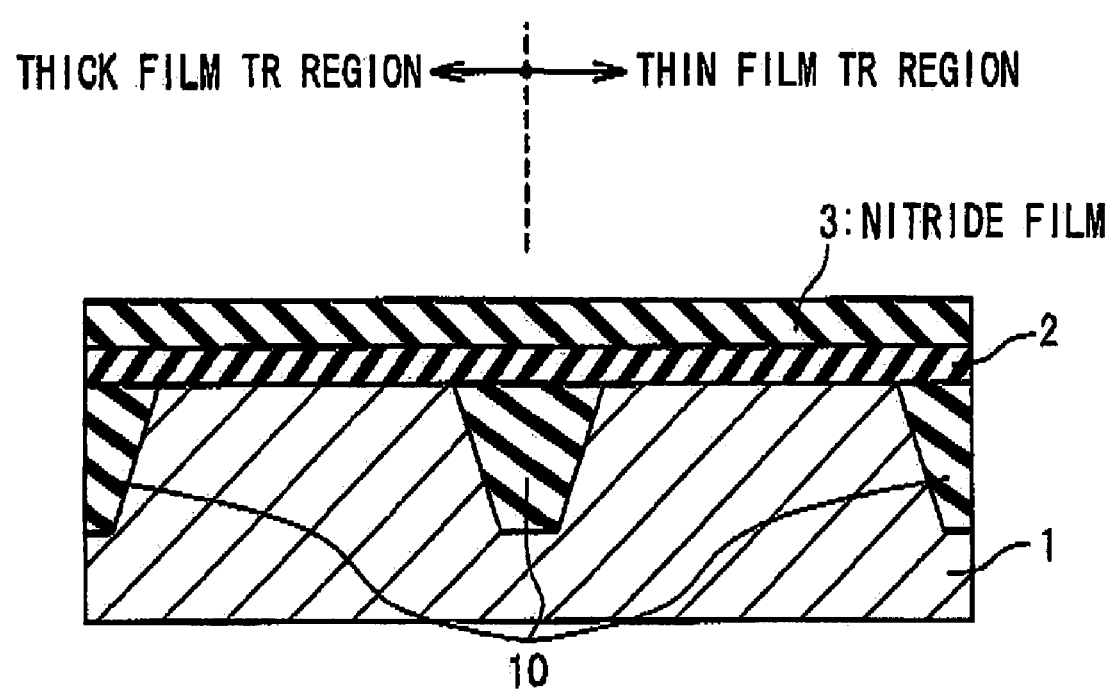

As shown in FIG. 4A, the isolation regions (STI: Shallow Trench: Isolation) 10 are firstly formed on the semiconductor substrate 1. Next, as shown in FIG. 4B, the semiconductor substrate 1 after the isolation is cleaned by a cleaning process. After that, the thin gate oxide film 2 is formed by an oxidizing process so as to cover the surface of the semiconductor substrate 1. The thin gate oxide film 2 has a film thickness of, for example, 3 nm and is exemplified as a silicon oxide film. The oxidization is executed by an ISSG (In Situ Steam Generation) method, for example, at 1050 degrees Celsius and $H_2$:5% atmosphere. After that, as shown in FIG. 4C, a nitride film 3 having a film thickness of about 15 nm is formed by a CVD method so as to cover the surface of the thin gate oxide film 2. The nitride film 3 is exemplified as a silicon nitride film.

Figure 5A:
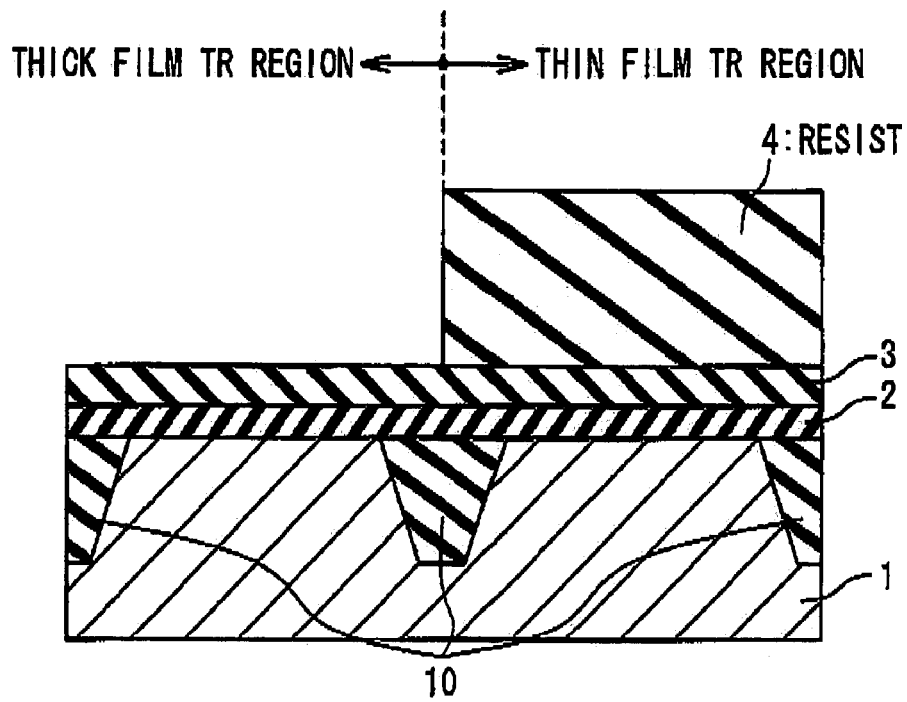
FIGS. 5A to 5C are sectional views showing an embodiment of a method of manufacturing a semiconductor device according to the present invention.
Figure 5B:
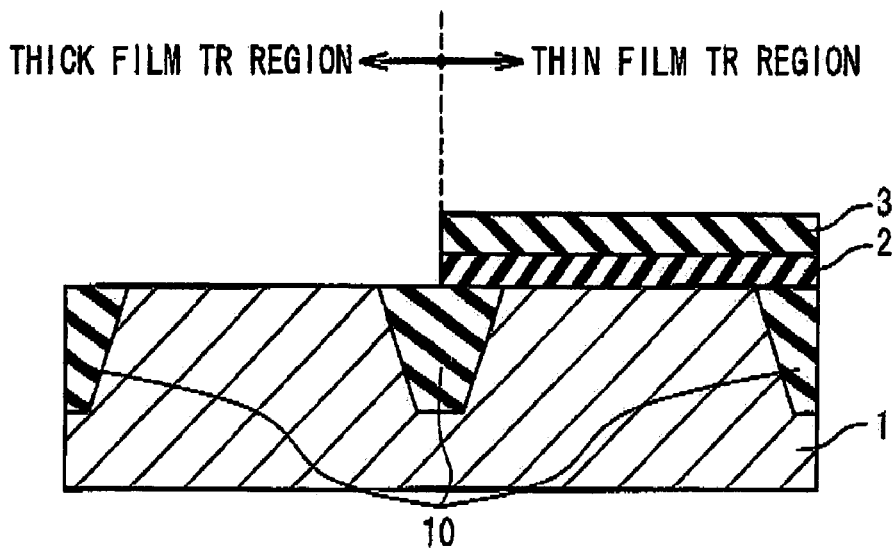

Next, as shown in FIG. 5A, a resist 4 is patterned by a lithography process such that the thin film Tr region is masked with the resist 4 while the thick film Tr region is not masked. Then, as shown in FIG. 5B, the nitride film 3 and the thin gate oxide film 2 in the thick film Tr region are etched by a dry-etching method. The dry etching is executed, for example, under etching gas: $Ar+CF_4$. Since the dry-etching method is used, as compared with the conventional method that removes the oxide film by using the chemical solution, it is possible to exactly form the boundary between the thin film Tr region and the thick film Tr region. That is, since the nitride film 3 is used as the hard mask and the dry-etching method is further used, it is possible to protect the irregularity in the boundary shape that is caused by the invasion of the chemical solution. Consequently, the improper boundary is not generated whose film thickness is improper such as the end 120 shown in FIG. 2B, and there is no bad influence on the subsequent processes.

Figure 5C:
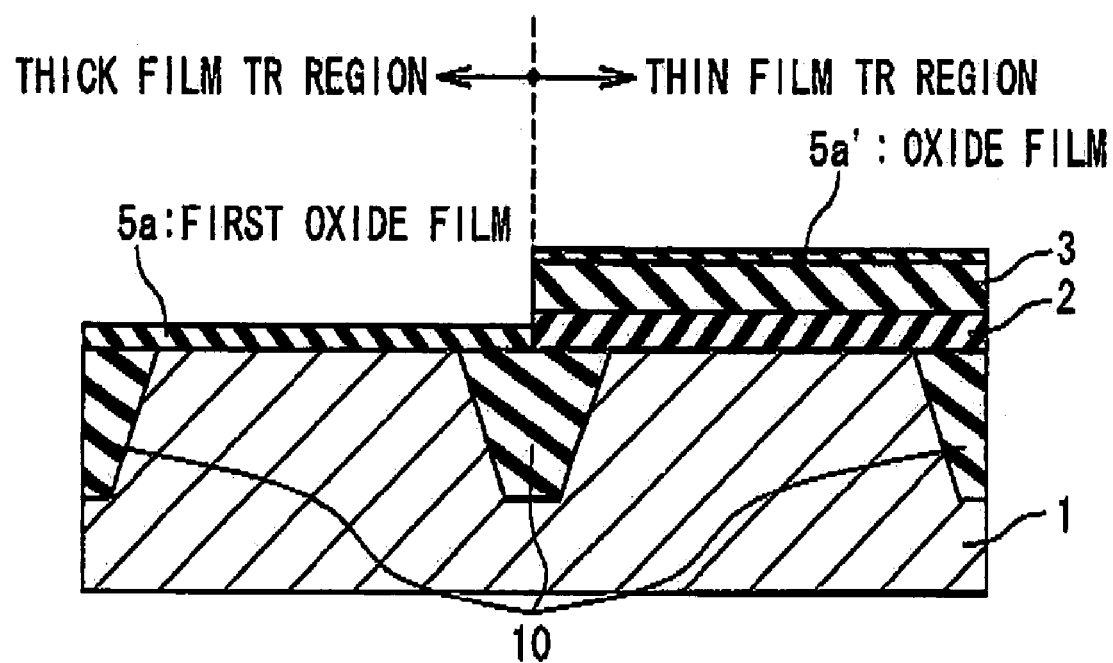

After the etching, the resist 4 in the thin film Tr region is removed. Next, as shown in FIG. 5C, annealing is executed in the mixed atmosphere of nitrogen and oxygen. The annealing condition is, for example, 900 degrees Celsius, $N_2$:$O_2$=1:1, and 30 sec. Since this substrate recovery process is executed through this annealing, it is possible to reduce the damage which may be caused by plasma at the time of the dry-etching. At this time, the thin first oxide film 5a is formed on the surface of the semiconductor substrate 1 in the thick film Tr region. At the same time, the oxide film 5a' is formed on the surface of the nitride film 3 in the thin film Tr region. The film thickness of the first oxide film 5a is, for example, 0.3 nm, and the first oxide film 5a is exemplified as the silicon oxide film. The film thickness of the oxide film 5a' is thinner than that of the first oxide film 5a, and the oxide film 5a' is exemplified as the silicon oxide film.

Figure 6A:
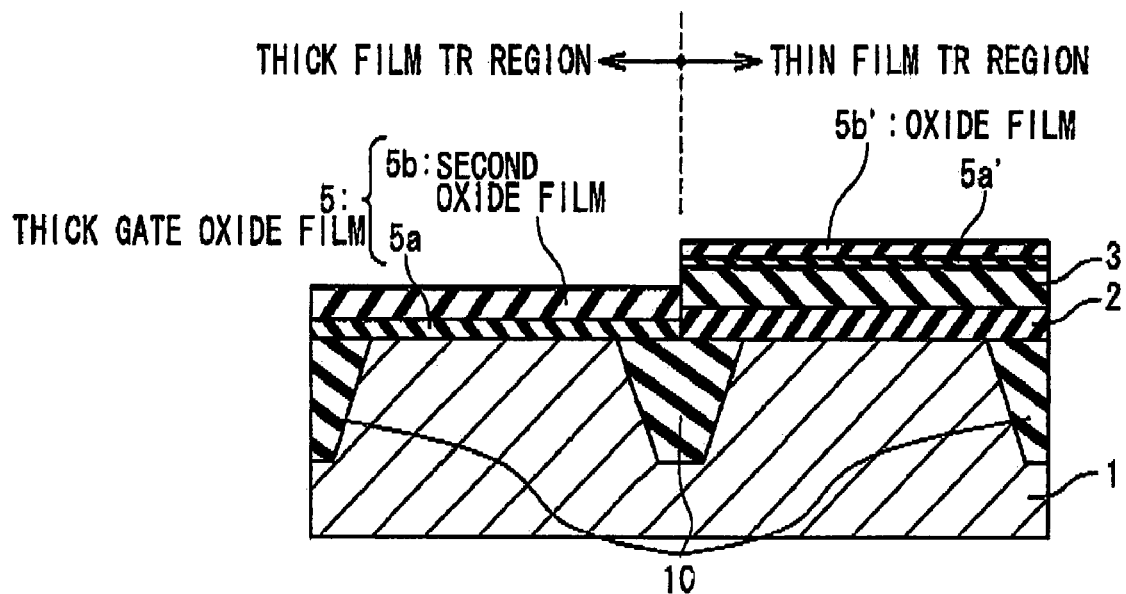
Figure 6B:
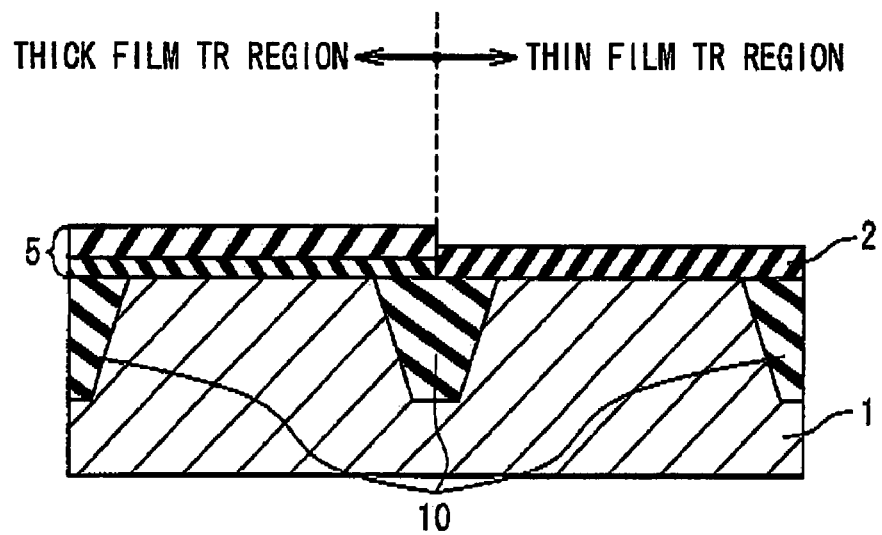

After that, as shown in FIG. 6A, a thick second oxide film 5b is formed by the oxidizing process so as to cover the surface of the thermal first oxide film 5a. The second oxide film 5b has a film thickness of, for example, 5.5 nm, and is exemplified as the silicon oxide film. The oxidization is executed by the ISSG method, for example, at 1050 degrees Celsius, $H_2$:5% atmosphere. Consequently, the thick gate oxide film 5 is formed in the thick film Tr region. Here, in the thick gate oxide film 5, the thin thermal first oxide film 5a and the thick second oxide film 5b are laminated in this order. On the other hand, by this oxidizing process, in the thin film Tr region, since the nitride film exist, a thin oxide film 5b' is formed on the thin oxide film 5a'. In succession, as shown in FIG. 6B, the thin oxide films 5b' and 5a' on the nitride film 3 in the thin film Tr region is firstly wet-etched by using an acid chemical solution. This leads to remove the oxide films 5b' and 5a' on the nitride film 3 in the thin film Tr region. At this time, the first and second oxide films 5a and 5b in the thick film Tr region are wet-etched just a little, which does not cause any problem. After that, the nitride film 3 in the thin film Tr region is removed by using the chemical solution which reacts with only a nitride film without reacting with an oxide film. Such chemical solution is exemplified as a high temperature phosphoric acid. As a result, in the thick film Tr region, the thick gate oxide film 5 is formed on the surface of the silicon substrate 1. On the other hand, in the thin film Tr region, the thin gate oxide film 2 is formed on the surface of the silicon substrate 1.

Figure 2A:
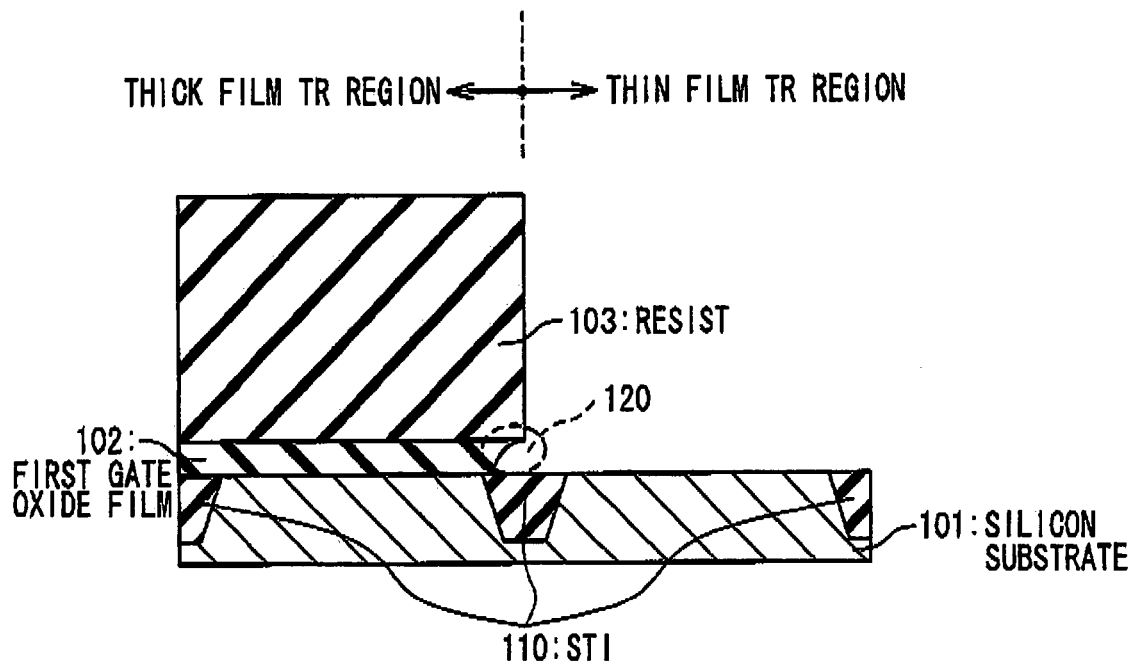
FIGS. 2A to 2C are sectional views showing a method of manufacturing a dual gate oxide film of a conventional technique.
Figure 2B:
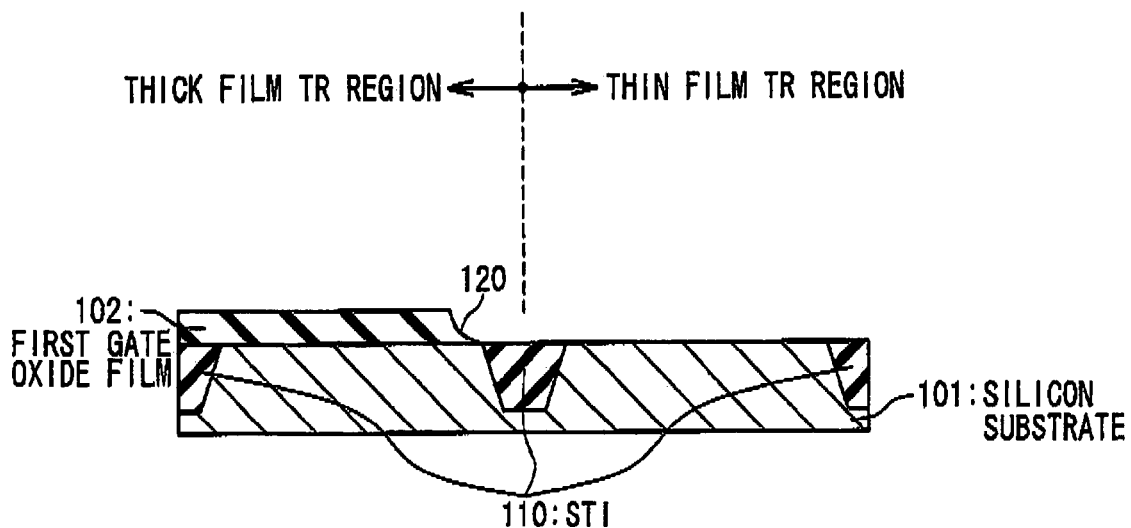
Figure 2C:
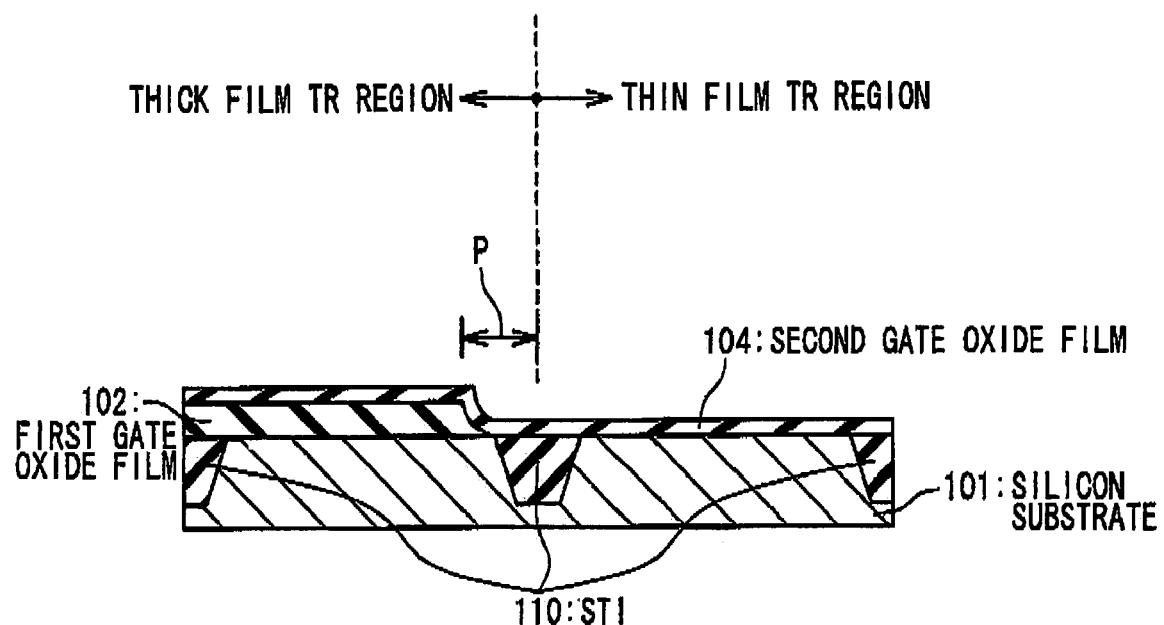

In this way, in the present invention, the oxide films 5b' and 5a' are removed by using the chemical solution which reacts with an oxide film rather than a nitride film, and the nitride film 3 in the thin film Tr region is removed by using the chemical solution which reacts with only a nitride film without reacting with an oxide film. Thus, as compared with the conventional method that removes the oxide film by using the chemical solution, it is possible to form exactly and sharply the boundary between the thin film Tr region and the thick film Tr region. Consequently, the improper boundary, whose film thickness is improper such as the end 120 shown in FIG. 2B, is not generated. In addition, it is possible to suppress and reduce the forbidden region such as the region P shown in FIG. 2C.

Incidentally, in FIG. 6B, the resist patterning process, the dry-etching process and the annealing process shown in FIGS. 5A, 5B and 5c may be used as the processes for removing the oxide films 5a' and 5b' and the nitride film 3 in the thin film Tr region. In that case, it is possible to obtain the effect similar to the case of using the chemical solution. In addition, since the chemical solution is not used at all, the dimensional control can be executed further accurately.

Next, as shown in FIG. 6C, a metal film is formed by using a sputtering method so as to cover a surface of the thick gate oxide film 5 in the thick film Tr region and a surface of the thin gate oxide film 2 in the thin film Tr region. In succession, the metal film and the thick gate oxide film 5 are patterned by the lithography and dry-etching processes so as to form the gate of the thick film gate transistor 19 at the predetermined position in the thick film Tr region. Simultaneously, the metal film and the thin gate oxide film 2 are patterned by the lithography and dry-etching processes so as to form the gate of the thin film gate transistor 18 at the predetermined position in the thin film Tr region. After that, ion implantation is executed in a self-alignment manner so as to form the source/drain regions (diffusion layers) 17a and 17b of the thick film gate transistor 19 and the source/drain regions (diffusion layers) 7a and 7b oft the thin film gate transistor 18. As mentioned above, the thick film gate transistor 19 is formed in the thick film Tr region, and the thin film gate transistor 18 is formed in the thin film Tr region.

In the present invention, without any use of the chemical solution to dissolve the oxide film, the gate oxide films having the film thicknesses different from each other can be formed on the same substrate. That is, although the conventional technique uses the chemical solution and performs the wet-etching and partially removes the oxide film, the present invention uses the nitride film as the hard mask and further uses the dry-etching and partially removes the oxide film. Consequently, it is possible to protect the invasion of the chemical solution in the boundary the between the thick film Tr region and the thin film Tr region and also possible to avoid the improper situation of the film thickness in the boundary.

According to the present invention, when the thin film gate transistor 18 and the thick film gate transistor 19 which have the gate oxide film thicknesses different from each other are formed on the same substrate, the side-etching caused by the chemical solution is not substantially generated in the boundary between the thin film Tr region and the thick film Tr region. Thus, it is possible to suppress the generating of the forbidden region in the boundary. Hence, it is possible to effectively use the region in the semiconductor device and also possible to attain the miniaturization of the semiconductor device efficiently without any waste of regions in a semiconductor chip. In addition, the dimension control becomes easy in the processes of manufacturing the semiconductor device.

In the present invention, at least one of the thin gate oxide film 2 and the thick gate oxide film 5 may be silicon oxynitride film.

According to the present invention, it is possible to reduce the forbidden region in the boundary between the thin film Tr region and the thick film Tr region. And, the miniaturization of the semiconductor device can be attained efficiently without any waste of regions in a semiconductor chip.

It is apparent that the present invention is not limited to the above embodiment that may be modified and changed without departing from the scope and spirit of the invention.

What is claimed is:

1. A method of manufacturing a semiconductor device comprising:
   (a) forming a first insulating film and a nitride film on a semiconductor substrate in this order;
   (b) removing said first insulating film and said nitride film in a first region while leaving said first insulating film and said nitride film in a second region;
   (c) forming a second insulating film on said semiconductor substrate in said first region, wherein a thickness of said second insulating film is different from that of said first insulating film, and a third insulating film is formed on said nitride film in said second region along with the formation of said second insulating film; and
   (d) removing said third insulating film and said nitride film in said second region.

2. The method of manufacturing a semiconductor device according to claim 1, wherein said step (d) includes:
   removing said third insulating film by using a chemical solution which dissolves said third insulating film rather than said nitride film, and
   removing said nitride film by using a chemical solution which dissolves said nitride film rather than said second insulating film.

3. The method of manufacturing a semiconductor device according to claim 1, wherein said step (d) includes:
   removing said third insulating film and said nitride film in said second region by a dry-etching method.

4. The method of manufacturing a semiconductor device according to claim 3, wherein said step (d) further includes:
   executing a heat treatment of said semiconductor substrate in an atmosphere having nitrogen and oxygen after said removing by the dry-etching method.

5. The method of manufacturing a semiconductor device according to claim 1, wherein said step (b) includes:
   removing said first insulating film and said nitride film in said first region by a dry-etching method.

6. The method of manufacturing a semiconductor device according to claim 5, wherein said step (b) further includes:
   executing a heat treatment of said semiconductor substrate in an atmosphere having nitrogen and oxygen after said removing by the dry-etching method.

7. The method of manufacturing a semiconductor device according to claim 5, wherein said step (d) includes:
   removing said third insulating film by using a chemical solution which dissolves said third insulating film rather than said nitride film, and
   removing said nitride film by using a chemical solution which dissolves said nitride film rather than said second insulating film.

8. The method of manufacturing a semiconductor device according to claim 5, wherein said step (d) includes:
   removing said third insulating film and said nitride film in said second region by a dry-etching method.

9. The method of manufacturing a semiconductor device according to claim 8, wherein said step (d) further includes:
   executing a heat treatment of said semiconductor substrate in an atmosphere having nitrogen and oxygen after said removing by the dry-etching method.

10. The method of manufacturing a semiconductor device according to claim 1, wherein said first insulating film is one of a silicon oxide film and a silicon oxynitride film,
    said second insulating film is one of a silicon oxide film and a silicon oxynitride film, and
    said nitride film is a silicon nitride film.

11. The method of manufacturing a semiconductor device according to claim 10, wherein said step (b) includes:
    removing said first insulating film and said nitride film in said first region by a dry-etching method.

12. The method of manufacturing a semiconductor device according to claim 11, wherein said step (b) further includes:
    executing a heat treatment of said semiconductor substrate in an atmosphere having nitrogen and oxygen after said removing by the dry-etching method.

13. The method of manufacturing a semiconductor device according to claim 12, wherein said step (c) includes:
    executing an oxidation of said semiconductor substrate,
    wherein said second insulating film is composed of an oxide film formed by said heat treatment and an oxide film formed by said oxidation on said semiconductor substrate, and
    said third insulating film is composed of an oxide film formed by said heat treatment and an oxide film formed by said oxidation film on said nitride film.

14. The method of manufacturing a semiconductor device according to claim 13, wherein said step (d) includes:

removing said third insulating film by using a chemical solution which dissolves said third insulating film rather than said nitride film, and removing said nitride film by using a chemical solution which dissolves said nitride film rather than said second insulating film.

15. The method of manufacturing a semiconductor device according to claim 13, wherein said step (d) includes:

removing said third insulating film and said nitride film in said second region by a dry-etching method.

16. The method of manufacturing a semiconductor device according to claim 15, wherein said step (d) further includes:

executing a heat treatment of said semiconductor substrate in an atmosphere having nitrogen and oxygen after said removing by the dry-etching method.

17. The method of manufacturing a semiconductor device according to claim 1, further comprising:

(e) forming a first gate of a first transistor at a predetermined position in said first region, and a second gate of a second transistor at a predetermined position in said second region; and (f) forming a source and a drain of said first transistor with respect to said first gate in a self-alignment manner, and a source and a drain of said second transistor with respect to said second gate in a self-alignment manner.

* * * * *